United States Patent
Wang et al.

(10) Patent No.: US 7,738,289 B2
(45) Date of Patent: Jun. 15, 2010

(54) MEMORY ACCESSING CIRCUIT AND METHOD

(75) Inventors: Min Chuan Wang, Taichung (TW); Chih Sheng Lin, Hsinchu County (TW); Keng Li Su, Hsinchu (TW); Wei Chun Chang, Tainan (TW)

(73) Assignee: Industrial Technology Research Institute, Hsinchu (TW)

( * ) Notice: Subject to any disclaimer, the term of this patent is extended or adjusted under 35 U.S.C. 154(b) by 228 days.

(21) Appl. No.: 12/155,787

(22) Filed: Jun. 10, 2008

(65) Prior Publication Data
US 2009/0141574 A1 Jun. 4, 2009

(30) Foreign Application Priority Data
Dec. 4, 2007 (TW) .............................. 96146013 A

(51) Int. Cl.
*G11C 11/00* (2006.01)
(52) U.S. Cl. .................. 365/158; 365/171; 365/173
(58) Field of Classification Search ................. 365/158, 365/171, 173
See application file for complete search history.

(56) References Cited

U.S. PATENT DOCUMENTS 6,778,428 B2 * 8/2004 Joo ............................ 365/158
6,791,887 B2 9/2004 Hung et al.

* cited by examiner

*Primary Examiner*—Son Dinh
*Assistant Examiner*—Nam Nguyen
(74) *Attorney, Agent, or Firm*—Bacon & Thomas, PLLC

(57) ABSTRACT

The present invention relates to a memory accessing circuit, which is for accessing a memory circuit with $2^N$ impedance states. The memory accessing circuit includes a testing signal generating circuit, for generating a testing signal by detecting the impedance state of the memory circuit; a reference signal generating circuit, for generating $2^{N-1}$ reference signals by detecting the impedance states of a reference circuit having $2^{N-1}$ impedance paths; a median signal generating circuit, for generating $(2^{N-1})-1$, median signals by receiving the $2^{N-1}$ reference signals; and a comparing circuit, for comparing the testing signal and the $(2^{N-1})$ median signals. The present invention further provides a memory accessing method thereof.

18 Claims, 5 Drawing Sheets

MEMORY ACCESSING CIRCUIT AND METHOD

BACKGROUND OF THE INVENTION

The present invention relates to a memory accessing circuit, especially a multi-state accessing circuit for accessing 4 or more states.

A known magnetic random access memory having 4 states is comprised of one large memory cell and one small memory cell as shown in FIG. 5A. By changing the magnetized polarities of the magnetized memory layers, resistors R1 and R2 can change resistance of the memory cell. Because the logic state of the memory cells having different resistances for 0 and 1, when applying bias to the memory cells, different currents are generated. By determining the value of the currents, the logic state of the memory cells being 0 or 1 can be determined.

Also, memory cell accessing rates are closely related to a sense amplifier. The faster for the sense amplifier determines the state of the memory cell, the better it is. The time it takes to determine the state of the memory cell is also related to the value of the current.

As shown in FIG. 5B, when the resistors R1 and R2 are connected in parallel, there are 4 variations, R1max//R2max, R1max//R2min, R1min//R2max, R1min//R2min, for representing 4 stored states 11, 10, 01, 00. Because a 4-state magnetic random accessing memory has 4 different resistance variations, when applied with constant direct current, 4 different memory currents can be generated.

In order to determine the stored state of the magnetic random accessing memory, the magnetic random accessing memory generates at least 3 sets of base values for comparing with the memory current of the magnetic random accessing memory to generate one of 4 comparison results and to determine the stored state of the magnetic random accessing memory.

As shown in FIG. 7, an accessing circuit has 3 reference paths for representing 3 different impedance levels [(Iref3: R1max//R2max//R1max//R2min), (Iref2: R1max//R2min//R1min//R2max), (Iref1: R1min//R2max//R1min//R2min)] and generating 3 reference currents ($I_{REF1}$, $I_{REF2}$, and $I_{REF3}$). By comparing the reference currents with the memory current, the most significant bit (MSB) $D_1$ and the least significant bit $D_0$ can be generated.

When a memory has more memory states (4 or more), the memory accessing circuit needs more reference paths. Because each reference path is comprised of multiple sets of resistors, more reference paths result in larger area of memory accessing circuits and greater power consumption.

SUMMARY OF THE INVENTION

The object of this invention is to provide an accessing circuit for multi-state memories, especially for a low power and high density memory device.

To achieve the above object, the present invention provides a memory accessing circuit for accessing a memory circuit having $2^N$ impedance states, comprising: a testing signal generating circuit, for generating a testing signal by detecting an impedance state of the memory circuit; a reference signal generating circuit, for detecting impedance states of a reference circuit having $2^{N-1}$ impedance states to generate $2^{N-1}$ reference signals; a median signal generating circuit, for receiving the $2^{N-1}$ reference signals and generating $(2^{N-1})-1$ median signals; and a comparing circuit, for comparing the testing signals with the $(2^{N-1})-1$ median signals and the $(2^{N-1})$ reference signals.

To achieve the above mentioned object, the present invention provides a memory accessing method for accessing a memory circuit having $2^N$ impedance states, comprising: generating a testing signal by detecting an impedance state of the memory circuit; generating $2^{N-1}$ reference signals by detecting impedance states of a reference circuit having $2^{N-1}$ impedance paths; generating $(2^{N-1})-1$ median signals by receiving the reference signals; and comparing the testing signal with the $(2^{N-1})-1$ median signals and the $(2^{N-1})$ reference signals.

Accordingly, the memory accessing circuit of the present invention is able to reduce the number of impedance paths of the reference circuit by using a median signal generating circuit and a reference signal generating circuit. The circuit area is reduced and the memory unit density of the memory device is increased. Power consumption is also reduced.

Other objects, features, and advantages of the invention will become apparent from the following detailed description of the preferred but non-limiting embodiments. The following description is made with reference to the accompanying drawings.

DETAILED DESCRIPTION OF THE INVENTION

The present invention discloses a memory accessing circuit and method, which receives an accessing signal from memory cells, compares the accessing signal with a plurality of reference signals generated from a reference circuit and a median signal, and determines the stored state of the memory.

Figure 1:
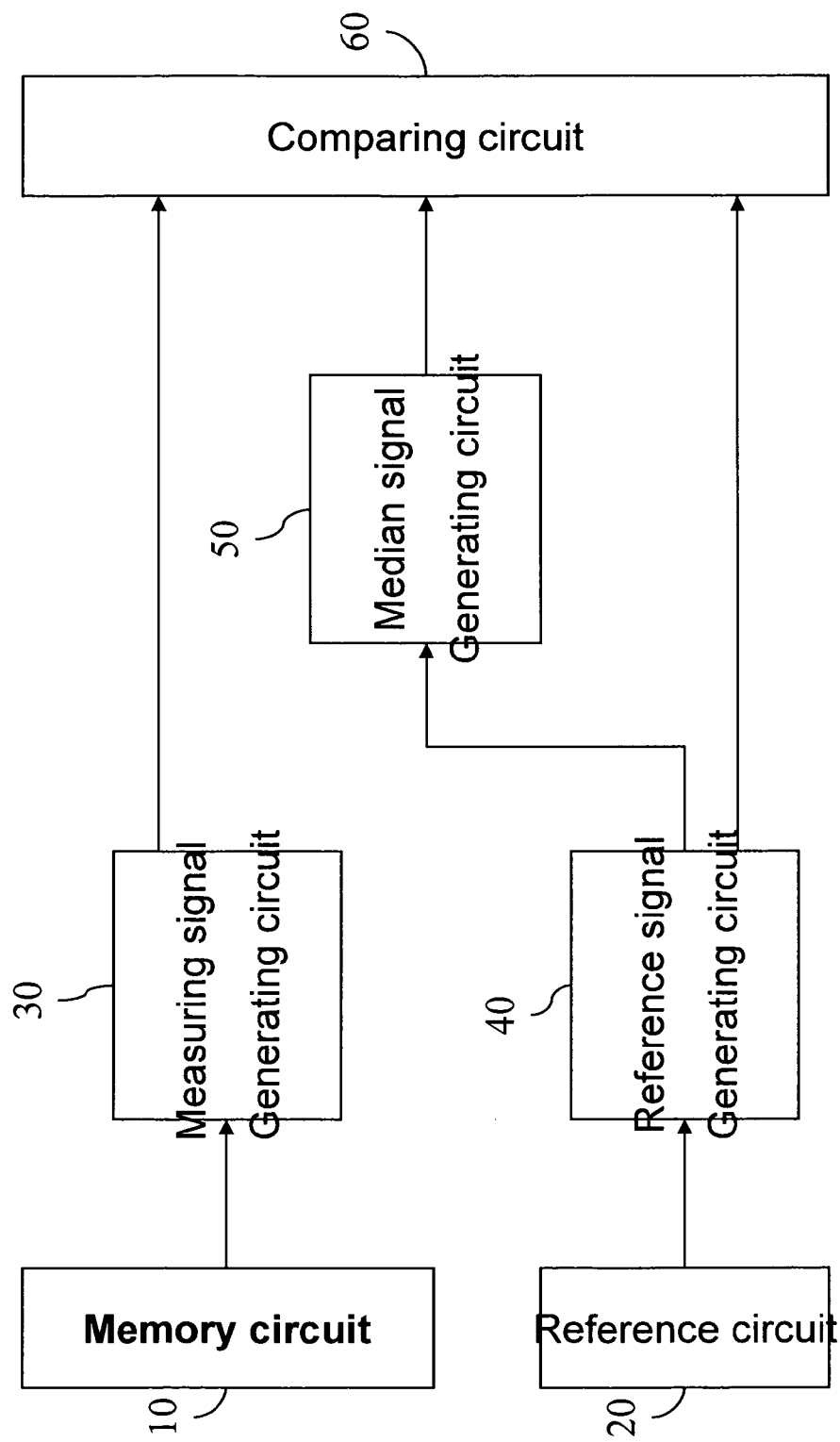
FIG. 1 depicts an exemplary memory accessing circuit system schematic in accordance with an embodiment of the current invention.

FIG. 1 is an exemplary memory accessing circuit system schematic. As shown, the memory accessing circuit comprises a memory circuit 10, a reference circuit 20, a testing signal generating circuit 30, a reference signal generating circuit 40, a median signal generating circuit 50, and a comparing circuit 60.

The memory circuit 10 is a memory cell of a memory and has multiple impedance states. The memory circuit 10 selects one of the impedance states to represent the stored state of the memory. The testing signal generating circuit 30 generates a testing signal according to the impedance state of the memory circuit 10 for determination of the stored state.

The reference circuit 20 generates multiple impedance paths according to the impedance states of the memory circuit 10, and the reference generating circuit 40 generates multiple reference signals according to the impedance paths as the base values for the testing signal generated by the testing signal generating circuit 30.

The median signal generating circuit 50 receives the reference signals generated by the reference circuit 20 and generates one or more sets of median signals. The reference signals and the median signals together form the base values for the memory circuit 10 and reduce the impedance paths needed by the reference circuit 20. When the memory circuit 10 has $2^N$ impedance states, to generate $(2^{N-1})+(2^{N-1})-1$ base values, the reference circuit 20 needs $2^{N-1}$ impedance paths and the median signal generating circuit 50 needs to generate $(2^{N-1})-1$ median signals.

The comparing circuit 60 compares the testing signal with the reference signals and the median signals, and generates a set of digital signals to represent the stored value of the memory circuit 10.

The memory accessing circuit of the present invention can be applied to multiple-state memories with 4 or more states. In an embodiment of the present invention, the memory accessing circuit is applied to a 4-state memory for the purpose of demonstrating the present invention.

Figure 2:
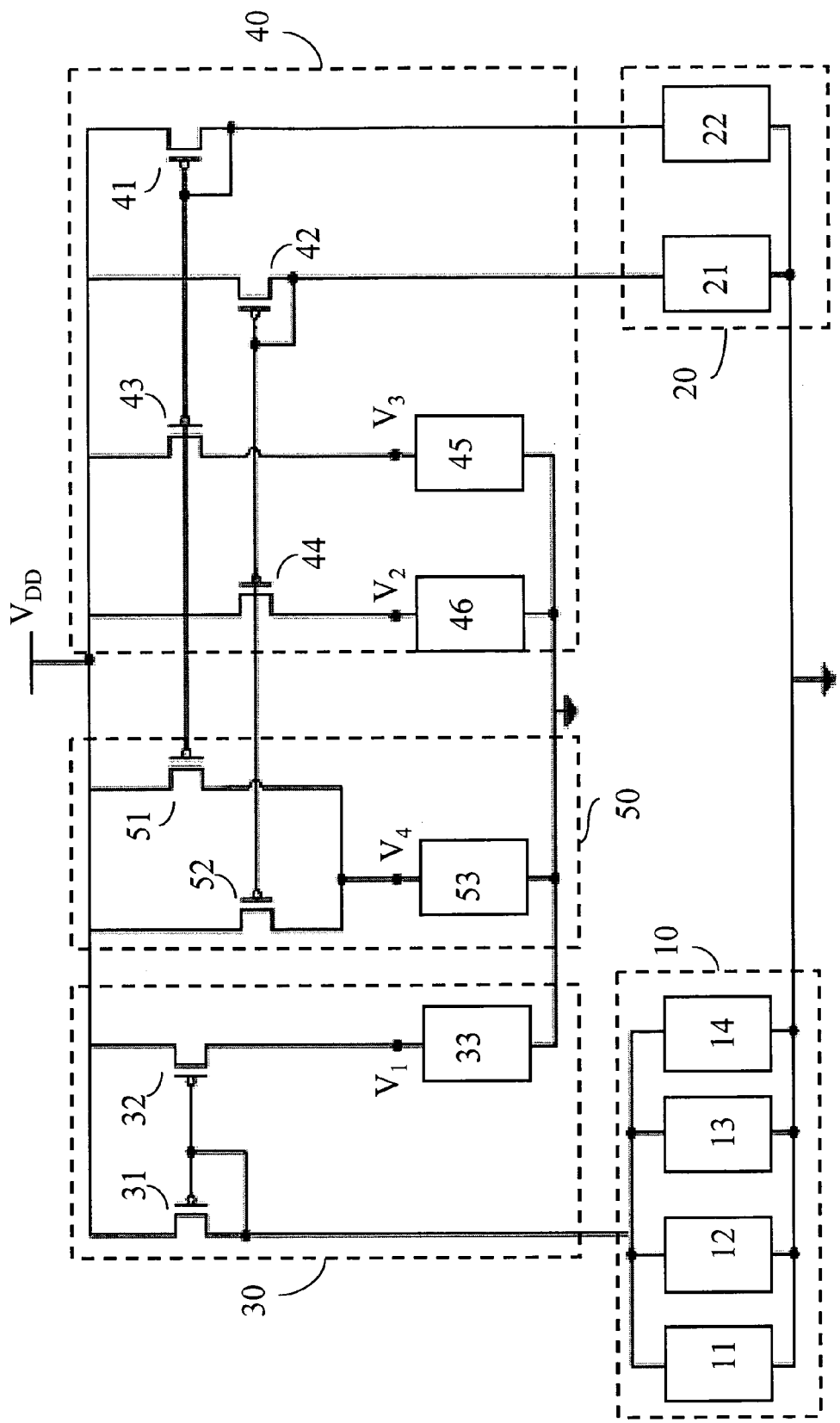
FIG. 2 depicts an exemplary circuitry schematic of a memory accessing circuit for a 4-state memory in accordance with an embodiment of the current invention.

FIG. 2 is an exemplary memory accessing circuit schematic for a 4-state memory. As shown, memory accessing circuit receives a direct current $V_{DD}$ so the memory circuit 10 and the reference circuit 20 can generate different current values according to different impedance states or impedance paths.

The memory circuit 10 is a magnetic random access memory (MRAM) and has two resistors, R1 and R2, having different resistances for representing 4 different impedance states 11, 12, 13, 14. Impedance state 11 represents R1max//R2max. Impedance state 12 represents R1max//R2min. Impedance 13 represents R1min//R2max. Impedance 14 represents R1min//R2min. Each represents one of four combinations (11, 10, 01, 00) of $[D_1, D_0]$, where $D_1$ is the most significant bit (MSB) and $D_0$ is the least significant bit (LSB). The reference circuit 20 corresponds to the memory circuit 10 having 2 impedance paths 21, 22, where the impedance 21 represents R1max//R2max//R1max//R2min and the impedance 22 represents R1min//R2max//R1min//R2min.

The testing signal generating circuit 30 provides the direct current $V_{DD}$ to the memory circuit 10 and generates a measuring current with 4 states according to the 4 different impedance states (11, 12, 13, 14) of the memory circuit 10. The testing signal generating circuit 30 further comprises 2 transistors 41, 43 and a set of transistors 42, 44 to form two current mirrors for mirroring the reference currents. The transistors 43, 44 are for mirroring the reference currents that pass through the transistors 41, 42 to 2 loads 45, 46 and for generating 2 reference voltages $V_2$, $V_3$.

The median signal generating circuit 50 comprises 2 transistors 51, 52 that form 2 current mirrors with the transistors 41, 42 of the reference signal generating circuit 40 respectively for mirroring 2 reference currents of the reference generating circuit 40 respectively and for generating a median reference voltage $V_4$.

In an embodiment of the present invention, in order to reduce the computing demand for determining the stored state of the memory, the loads 33, 45, 46 have the same impedance 2P so the measuring voltage $V_1$ and the reference voltages $V_2$, $V_3$ are substantially direct proportional to the measuring current and the reference currents. Because the current value of the median reference current is the sum of the 2 reference currents, the load 53 has an impedance P and the median reference voltage $V_4$ generated by the load 53 is between the reference voltages $V_2$, $V_3$. The direct current $V_{DD}$ is for determining the current values of the measuring current and the reference currents, and for controlling the accessing time of the memory accessing circuit.

In another embodiment of the present invention, in order to reduce the computing demand for determining the memory stored state, the loads 33, 45, 46 have the same impedance 2P so the measuring voltage $V_1$ and the reference voltages $V_2$, $V_3$ are substantially direct proportional to the measuring current and the reference currents. Also, the transistors 51, 52 adjust the current value of the current mirrors so that the current value of the median reference current and the sum of the current values of the reference currents are not equal, so the median reference voltage $V_4$ generated by the load 53 is between the reference voltages $V_2$, $V_3$. The direct current $V_{DD}$ is for determining the current values of the measuring current and the reference currents, and for controlling the accessing time of the memory accessing circuit.

Figure 3:
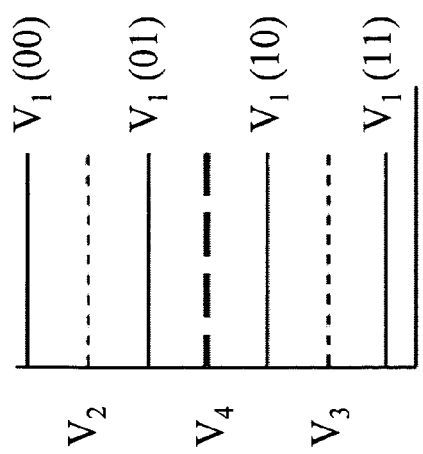
FIG. 3 depicts an exemplary voltage-stored state chart in accordance with an embodiment of the current invention.
Figure 5B:
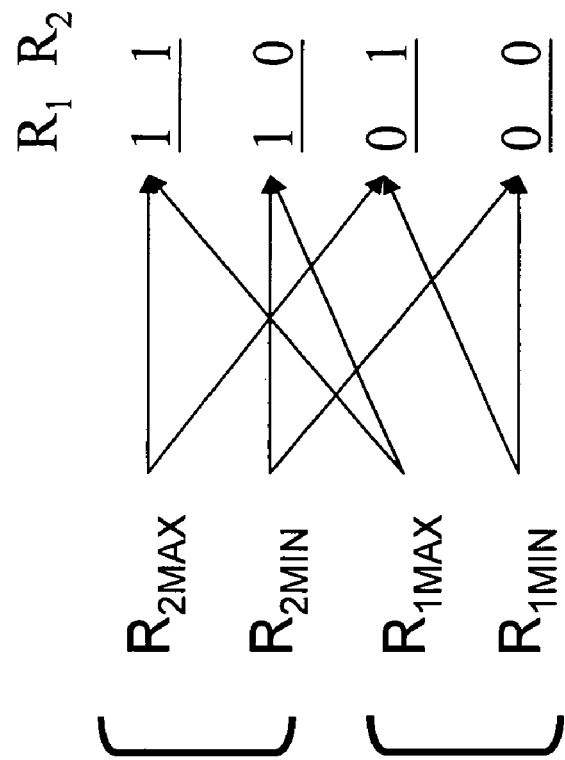
FIG. 5 is the circuitry schematic of a prior art magnetic random accessing memory.
Figure 5A:
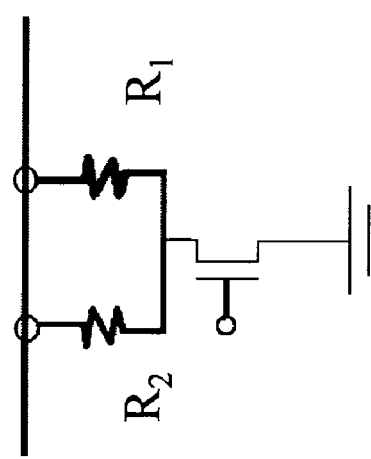
Figure 7:
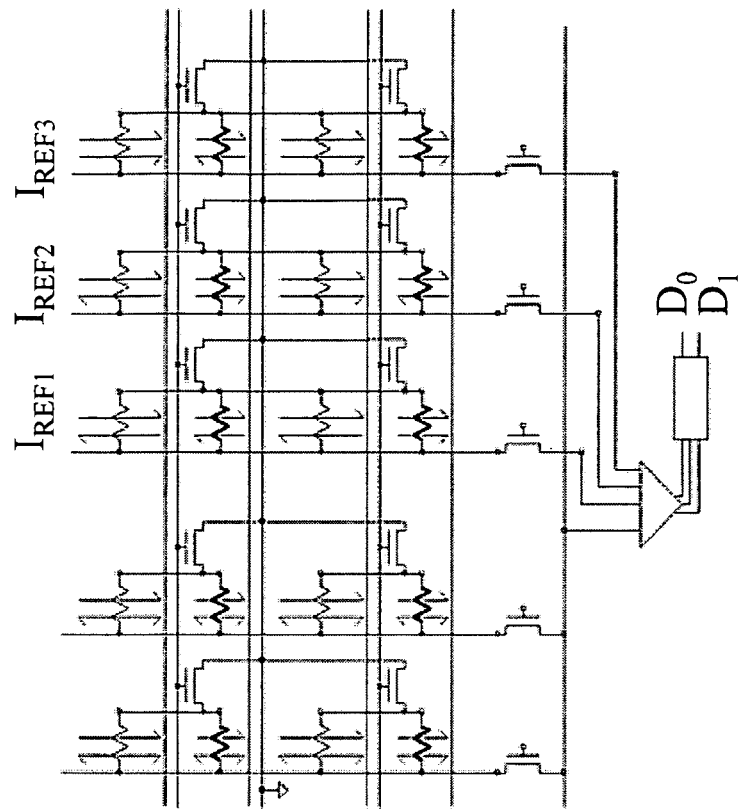
FIG. 7 is a circuitry schematic of the prior art accessing circuit.
Figure 6:
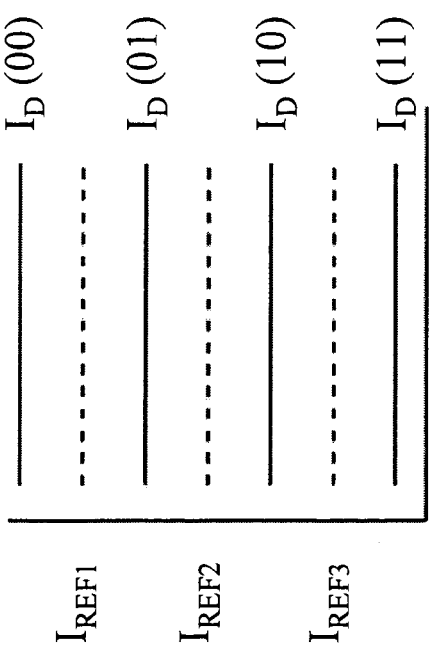
FIG. 6 is the voltage-stored state chart of the prior art magnetic random accessing memory.

FIG. 3 is a measuring voltage-stored state chart of an embodiment of the present invention. As shown, the reference voltages $V_2$, $V_3$ and the median reference voltage $V_4$ form 3 voltage base values. The measuring voltage $V_1$ is compared with the reference voltages $V_2$, $V_3$ and the median reference voltage $V_4$ to generate 4 different states.

When the measuring voltage $V_1$ is less than the reference voltages $V_2$, $V_3$ and the median reference voltage $V_4$, the impedance state of the memory circuit 10 is 11 (R1max//R2max), which means the MSB and the LSB values are [11]. When the measuring voltage $V_1$ is in between the reference voltage $V_3$ and the median reference voltage $V_4$, the impedance state of the memory circuit 10 is 12 (R1max//R2min), which means the MSB and the LSB values are [10]. When the measuring voltage $V_1$ is in between the reference voltage $V_2$ and the median reference voltage $V_4$, the impedance state of the memory circuit 10 is 13 (R1min//R2max), which means the MSB and the LSB values are [01]. When the measuring voltage $V_1$ is greater than the reference voltages $V_2$, $V_3$ and the median reference voltage $V_4$, the impedance state of the memory circuit is 14 (R1min//R2min), which means the MSB and the LSB values are [00].

Figure 4B:
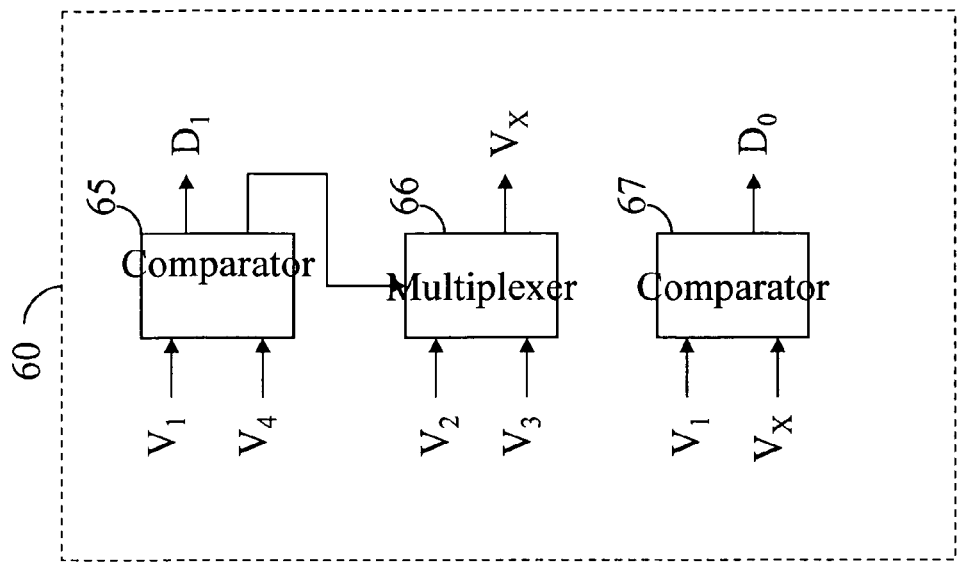
FIG. 4B is an exemplary circuitry of a comparing circuit in accordance with the second embodiment of the current invention.
Figure 4A:
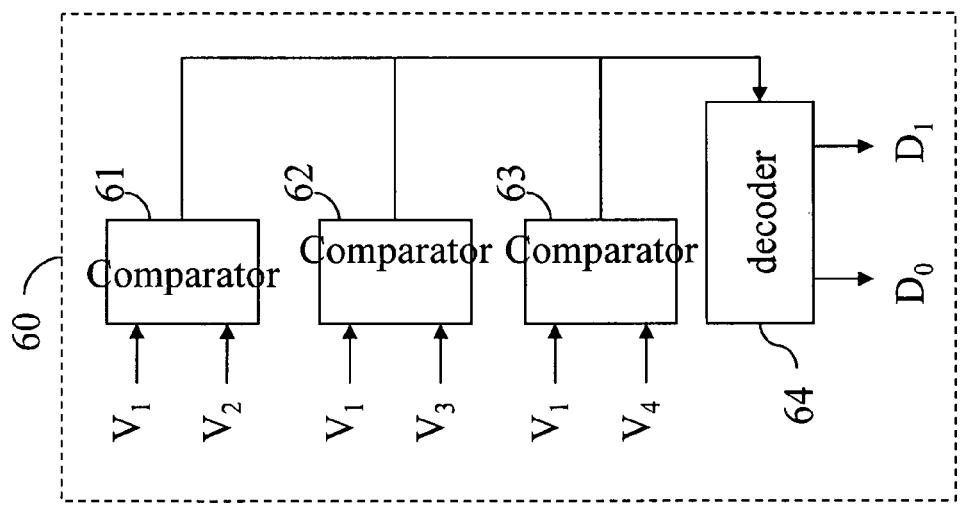
FIG. 4A is an exemplary circuitry of a comparing circuit in accordance with the first embodiment of the current invention.

The comparing circuit 60 compares the measuring voltage $V_1$ with the reference voltages $V_2$, $V_3$ and the median reference voltage $V_4$ and determines the stored state of the memory circuit represented by the measuring voltage $V_1$. In an embodiment of the present invention, the measuring voltage $V_1$ is directly compared with the reference voltages $V_2$, $V_3$ and the median reference voltage $V_4$. FIG. 4A is an exemplary comparing circuit 60 schematic in accordance with an embodiment of the present invention. The comparing circuit 60 comprises 3 comparators 61, 62, 63 for comparing the measuring voltage $V_1$ with the reference voltage $V_2$, the reference voltage $V_3$, and the median reference voltage $V_4$ respectively. The comparison results of the comparators 61, 62, 63 are outputted to a decoder 64, and the decoder 64 determines the MSB and the LSB values $[D_1, D_0]$.

In another embodiment of the present invention, the measuring voltage $V_1$ is first compared with the median reference voltage $V_4$ to get the MSB value $D_1$. The measuring voltage $V_1$ is then compared with the reference voltage $V_2$ or the reference voltage $V_3$ depending on the value of the MSB value $D_1$ to get the LSB value $D_0$. FIG. 4B is a comparing circuit 60 schematic in accordance with the embodiment of the present invention. The comparing circuit 60 comprises a comparator 65 for comparing the measuring voltage $V_1$ with the median reference voltage $V_4$ to get the MSB value $D_1$. When the measuring voltage $V_1$ is greater than the median reference voltage $V_4$, $D_1=0$. When the measuring voltage $V_1$ is smaller than the median reference voltage $V_4$, $D_1=1$.

The value of $D_1$ is outputted to a multiplexer 66 having 2 inputs and 1 output. The multiplexer 66 receives the reference voltages $V_2$, $V_3$ at the same time and outputs a selective voltage $V_x$. When $D_1=0$, the multiplexer 66 outputs $V_2$ as $V_x$. When $D_1=1$, the multiplexer 66 outputs $V_1$ as $V_x$. A comparator 67 is provided for comparing the selective voltage $V_x$ with the measuring voltage $V_1$ to get the LSB value $D_0$. When the measuring voltage $V_1$ is greater than the selective voltage $V_x$, the value of $D_0=0$. When the measuring voltage $V_1$ is smaller than the selective voltage $V_x$, the value of $D_0=1$.

According to the embodiments, the memory accessing circuit of the present invention accesses the stored state of the memory circuit with less impedance paths of the reference circuits by using a median signal generating circuit with a reference signal generating circuits. As a result, area of circuitry is reduced, density of the memory unit is increased, and power consumption is reduced.

While the preferred embodiments of the present invention have been set forth for the purpose of disclosure, modifications of the disclosed embodiments of the present invention as well as other embodiments thereof may occur to those skilled in the art. Accordingly, the appended claims are intended to cover all embodiments which do not depart from the spirit and scope of the present invention.

We claim:

1. A memory accessing circuit for accessing a memory circuit having $2^N$ impedance states, comprising:
   a testing signal generating circuit, for generating a testing signal by detecting an impedance state of the memory circuit;
   a reference signal generating circuit, for generating $2^{N-1}$ reference signals by detecting impedance states of a reference circuit having $2^{N-1}$ impedance paths;
   a median signal generating circuit, for generating $(2^{N-1})-1$ median signals by receiving the $2^{N-1}$ reference signals; and
   a comparing circuit, for comparing the testing signal with the $(2^{N-1})-1$ median signals.

2. The memory accessing circuit of claim 1, wherein the memory circuit and the reference circuit receive a voltage to generate the testing signal and the $2^{N-1}$ reference signals respectively.

3. The memory accessing circuit of claim 2, wherein the testing signal is a measuring current or a measuring voltage and the reference signals are reference currents or reference voltages.

4. The memory accessing circuit of claim 3, wherein the median signal generating circuit computes the received $2^{N-1}$ reference currents to generate $(2^{N-1})-1$ median currents.

5. The memory accessing circuit of claim 3, wherein the median signal generating circuit computes the received $2^{N-1}$ reference voltages to generate $(2^{N-1})-1$ median voltages.

6. The memory accessing circuit of claim 5, wherein any one of the median voltages is a voltage in between any two of the reference voltages.

7. The memory accessing circuit of claim 4, wherein the measuring current and the $2^{N-1}$ reference currents each passes through a load to generate a measuring voltage and $2^{N-1}$ reference voltages respectively, and the $(2^{N-1})-1$ median current pass through the load to generate $(2^{N-1})-1$ median voltages.

8. The memory accessing circuit of claim 5, wherein the comparing circuit compares the measuring voltage with the reference voltages and the median voltages respectively to generate a comparison result.

9. The memory accessing circuit of claim 1, wherein the comparing circuit further comprises a decoder, for converting a comparison result into a digital value to represent one of the $2^N$ impedance states.

10. The memory accessing circuit of claim 1, wherein the reference signal generating circuit generates corresponding reference currents according to the impedance paths, and the median signal generating circuit receives the reference currents to generate the median signals.

11. The memory accessing circuit of claim 1, wherein the comparing circuit further compares the testing signal with one of the reference signals according to a comparison result between the testing signal and the median signal.

12. A memory accessing method for accessing a memory circuit having $2^N$ impedance states, comprising:
    generating a testing signal by detecting an impedance state of the memory circuit;
    generating $2^{N-1}$ reference signals by detecting impedance states of a reference circuit having $2^{N-1}$ impedance paths;
    generating a median signal by receiving the reference signals; and
    comparing the testing signal with the $(2^{N-1})-1$ median signals.

13. The memory accessing method of claim 12, wherein the memory circuit and the reference circuit receive a voltage to generate the testing signal and the 2N−1 reference signals respectively, and the testing signal is a measuring current or a measuring voltage and the reference voltages are reference currents or reference voltages.

14. The memory accessing method of claim 13, wherein the median signal generating circuit computes the received $2^{N-1}$ reference currents to generate $(2^{N-1})-1$ median currents.

15. The memory accessing method of claim 13, wherein the median signal generating circuit computes the received $2^{N-1}$ reference voltages to generate $(2^{N-1})-1$ median voltages.

16. The memory accessing method of claim 14, wherein the measuring current and the $2^{N-1}$ reference currents each passes through a load to generate a measuring voltage and $2^{N-1}$ reference voltages respectively, and the $(2^{N-1})-1$ median current pass through the load to generate $(2^{N-1})-1$ median voltages.

17. The memory accessing method of claim 15, wherein the comparing circuit compares the measuring voltage with the reference voltages and the median voltages respectively to generate a comparison result.

18. The memory accessing method of claim 12, wherein the comparing circuit further compares the testing signal with one of the reference signals according to a comparison result between the testing signal and the median signal.

* * * * *